United States Patent
Feng et al.

(10) Patent No.: US 8,918,742 B2
(45) Date of Patent: Dec. 23, 2014

(54) METHODS AND SYSTEMS FOR PATTERN DESIGN WITH TAILORED RESPONSE TO WAVEFRONT ABERRATION

(75) Inventors: Hanying Feng, Fremont, CA (US); Yu Cao, Saratoga, CA (US); Jun Ye, Palo Alto, CA (US); Youping Zhang, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/542,625

(22) Filed: Jul. 5, 2012

(65) Prior Publication Data

US 2013/0014065 A1    Jan. 10, 2013

Related U.S. Application Data

(60) Provisional application No. 61/505,904, filed on Jul. 8, 2011.

(51) Int. Cl.
| | | |
|---|---|---|
| G06F 17/50 | (2006.01) | |
| G03B 27/54 | (2006.01) | |
| G03F 7/20  | (2006.01) | |

(52) U.S. Cl.
CPC ............ G03F 7/706 (2013.01); G03F 7/70683 (2013.01)
USPC ................... 716/51; 716/52; 716/53; 716/54; 716/55; 716/56; 355/67

(58) Field of Classification Search
USPC ......................................... 716/51–56; 355/67
See application file for complete search history.

(56) References Cited

U.S. PATENT DOCUMENTS

| 6,567,226 B2 * | 5/2003 | Fuse ............................ 359/563 |
| 6,871,337 B2 * | 3/2005 | Socha ............................ 716/54 |

(Continued)

FOREIGN PATENT DOCUMENTS

| JP | H11-184070 | 7/1999 |
| JP | 2001-029431 | 2/2001 |

(Continued)

OTHER PUBLICATIONS

Okamoto et al.; "New concept phase shifting masks based on projection lens design"; Publication Year: 2004, Industrial Electronics Society, 2004. IECON 2004. 30th Annual Conference of IEEE; pp. 1550-1554;vol. 2.*

(Continued)

*Primary Examiner* — Helen Rossoshek
(74) *Attorney, Agent, or Firm* — Pillsbury Winthrop Shaw Pittman LLP

(57) ABSTRACT

The present invention relates to methods and systems for designing gauge patterns that are extremely sensitive to parameter variation, and thus robust against random and repetitive measurement errors in calibration of a lithographic process utilized to image a target design having a plurality of features. The method may include identifying most sensitive line width/pitch combination with optimal assist feature placement which leads to most sensitive CD (or other lithography response parameter) changes against lithography process parameter variations, such as wavefront aberration parameter variation. The method may also include designing gauges which have more than one test patterns, such that a combined response of the gauge can be tailored to generate a certain response to wavefront-related or other lithographic process parameters. The sensitivity against parameter variation leads to robust performance against random measurement error and/or any other measurement error.

21 Claims, 9 Drawing Sheets

(56) References Cited

U.S. PATENT DOCUMENTS

| | | | |
|---|---|---|---|
| 7,242,475 B2* | 7/2007 | Baselmans et al. | 356/399 |
| 7,266,800 B2* | 9/2007 | Sezginer | 716/52 |
| 7,310,796 B2 | 12/2007 | Schwarzband | |
| 7,587,704 B2 | 9/2009 | Ye et al. | |
| 7,623,220 B2* | 11/2009 | Granik | 355/67 |
| 7,832,864 B2* | 11/2010 | Barrett et al. | 351/205 |
| 8,245,160 B2* | 8/2012 | Ye et al. | 716/50 |
| 8,560,978 B2* | 10/2013 | Feng et al. | 716/52 |
| 2006/0048090 A1 | 3/2006 | Feldman | |
| 2009/0296055 A1* | 12/2009 | Ye et al. | 355/30 |
| 2010/0122225 A1* | 5/2010 | Cao et al. | 716/4 |
| 2011/0116067 A1* | 5/2011 | Ye et al. | 355/67 |
| 2011/0224956 A1 | 9/2011 | Ye et al. | |
| 2012/0075605 A1* | 3/2012 | Chen | 355/67 |
| 2012/0113404 A1* | 5/2012 | Hsu et al. | 355/67 |
| 2012/0117521 A1* | 5/2012 | Feng et al. | 716/54 |
| 2012/0117522 A1* | 5/2012 | Feng et al. | 716/54 |
| 2012/0123748 A1* | 5/2012 | Aben et al. | 703/2 |
| 2012/0124529 A1* | 5/2012 | Feng et al. | 716/54 |
| 2013/0179847 A1* | 7/2013 | Hansen | 716/54 |
| 2014/0033145 A1* | 1/2014 | Feng et al. | 716/54 |

FOREIGN PATENT DOCUMENTS

| | | |
|---|---|---|
| JP | 2001-074606 | 3/2001 |
| JP | 2002-025884 | 1/2002 |
| JP | 2004-079586 | 3/2004 |
| JP | 2004-253673 | 9/2004 |
| JP | 2010-021443 | 1/2010 |
| WO | 2010/054350 | 5/2010 |

OTHER PUBLICATIONS

Hiroshi Nomura, "Accurate Measurement of Spherical and Astigmatic Aberrations by a Phase Shift Grating Reticle," Jpn. J. Appl. Phys., vol. 40, pp. 6316-6322 (2001).

James C. Wyant et al., "Chapter 1: Basic Wavefront Aberration Theory for Optical Metrology," Applied Optics and Optical Engineering, vol. XI, Academic Press, pp. 28-39 (1992).

* cited by examiner

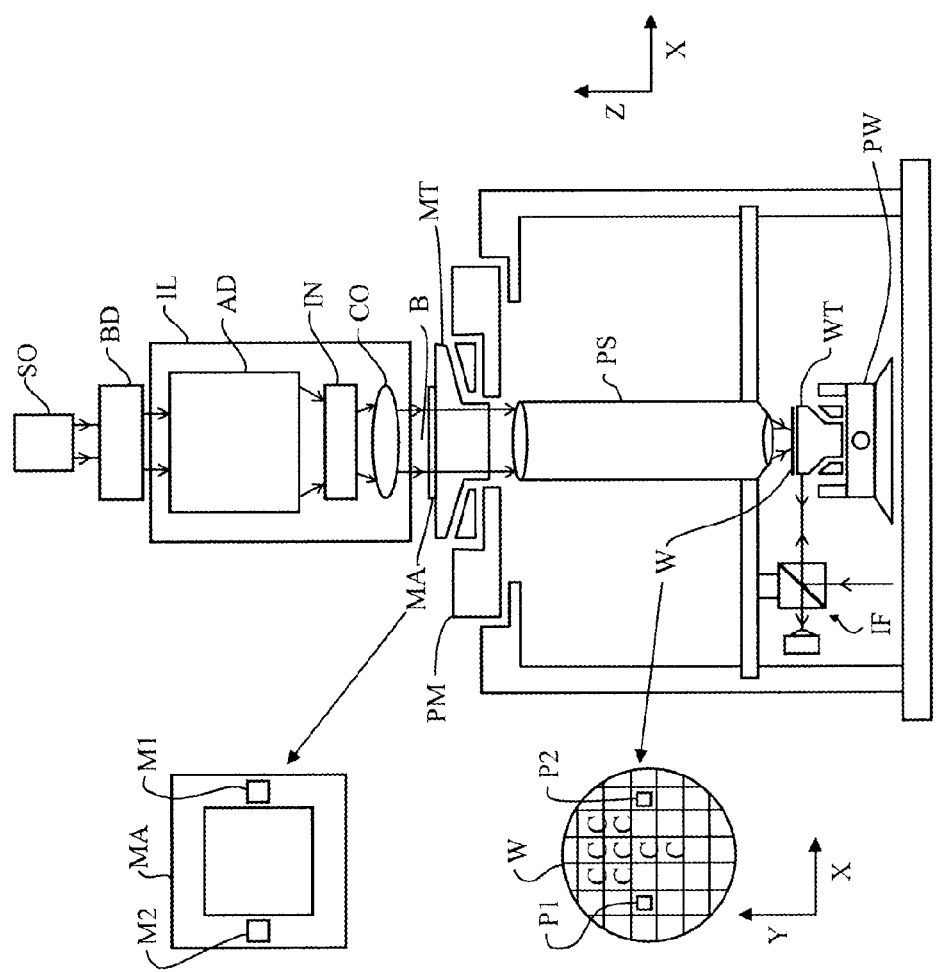

US 8,918,742 B2

METHODS AND SYSTEMS FOR PATTERN DESIGN WITH TAILORED RESPONSE TO WAVEFRONT ABERRATION

CROSS-REFERENCE TO RELATED APPLICATIONS

This application claims priority to U.S. Provisional Application No. 61/505,904, filed Jul. 8, 2011, which is incorporated herein by reference in its entirety.

FIELD OF INVENTION

The technical field of the present invention relates generally to methods, systems, and program products for designing gauge patterns associated with a lithography process, and more specifically to computationally efficient designs for gauge patterns that are responsive to lithography parameter variations.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M(generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example of RET, optical proximity correction (OPC), addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and method, and may require robust models that describe the lithography process precisely. Calibration procedures for such lithography models are thus required that provide models being valid, robust and accurate across the process window. Currently, calibration is done using a certain number of 1-dimensional and/or 2-dimensional gauge patterns with wafer measurements. More specifically, those 1-dimensional gauge patterns are line-space patterns with varying pitch and CD, and the 2-dimensional gauge patterns typically include line-ends, contacts, and randomly selected SRAM (Static Random Access Memory) patterns. These patterns are then imaged onto a wafer and resulting wafer CDs or contact energy are measured. The original gauge patterns and their wafer measurements are then used jointly to determine the model parameters which minimize the difference between model predictions and wafer measurements.

Unfortunately, there has not been much systematic study on the design and efficacy of gauge patterns. Conventional gauge patterns selection method is rather arbitrary: they may simply be chosen from experience, or randomly chosen from the real circuit patterns. Such patterns are often incomplete or super-complete or both for calibration. In particular, for some process parameters, all the patterns may be quite insensitive, thus it may be difficult to determine the parameter values due to measurement inaccuracies. While on the other hand, many patterns may have very similar responses to parameter variations, thus some of them are redundant and wafer measurements on these redundant patterns waste a lot of resources. Co-owned co-pending U.S. patent application Ser. No. 13/128,630, titled, "Methods and Systems for Parameter-Sensitive and Orthogonal Gauge Design for Lithography Calibration," (equivalent to WIPO publication no. WO 2010/054350), and US patent publication no. 2010/0122225, titled, "Pattern Selection for Lithographic Model Calibration," address some of these issues. But the methods disclosed in the above two applications are not tailored to be particularly responsive to wavefront aberration terms, which typically show strong non-linear effects in imaging in a lithography model. An aberration monitoring approach was proposed in the article, titled, "Accurate Measurement of Spherical and Astigmatic Aberrations by a Phase Shift Grating Reticle", by H. Nomura, Japan. J. Appl. Phys. Vol. 40 (2001) pp. 6316-6322. In that approach, aberrations are monitored through symmetric and rotated repeated Phase-Shift-Gratings (PSG). That approach requires Phase-Shift-Mask (PSM) and poses additional constraints on pitch and adjustable mask parameters. Further, it requires specific constraints on the illumination source, which are not always amenable and/or practical. Therefore, what is needed is a flexible and computationally efficient method for designing gauges whose sensitivity to aberration terms can be tailored according to lithography system/process requirement.

SUMMARY OF THE INVENTION

The present invention provides a number of innovations in the area of lithography simulation methods which allow for a computationally efficient technique for designing gauge patterns for calibration/monitoring use in a lithography system (physical system or virtual model of a physical system), and which overcomes the foregoing deficiencies of the prior art techniques.

More specifically, the present invention relates to methods of designing gauge patterns that are extremely sensitive to parameter variations, and are thus robust against random and repetitive measurement errors in calibration of a lithographic process utilized to image a target design having a plurality of features. The method may include identifying most sensitive line width/pitch combination with optimal assist feature placement which leads to most sensitive CD (or other lithography response parameter) changes against lithography process parameter variations, such as, wavefront aberration parameter variation. The method may also include designing gauges which have more than one test patterns, such that a combined response of the gauge can be tailored to generate a certain response to wavefront-related or other lithographic process parameters. The sensitivity against parameter variation leads to robust performance against random measurement error and/or any other measurement error.

In one aspect of the invention, a method of designing a set of test patterns for being imaged via a projection lithography system is disclosed, wherein the set of test patterns comprises a lithography response parameter related to a predefined wavefront aberration term of the projection lithography system, the predefined wavefront aberration term mathematically representing a characteristic of a wavefront aberration. The method comprises the steps of: a) generating a mathematical series expansion as an approximation of the lithography response parameter as a function of the predefined wavefront aberration term; b) selecting a set of selected expansion terms from the mathematical series expansion; c) generating a cost function comprising the selected expansion terms; and, d) solving the cost function to define the parameter of the set of test patterns while constraining at least part of the unselected expansion terms substantially to zero. Note that the set of test patterns may comprise a singular pattern or a plurality of patterns. While individual response of a singular pattern may be non-linear, the combined response of the plurality of patterns in a gauge may be linear or tailored otherwise.

In another aspect of the present invention, a set of test patterns for being imaged via a projection lithography system is disclosed, the set of test patterns being substantially binary test patterns and comprising a lithography response parameter related to a predefined wavefront aberration term of the projection lithography system, the predefined wavefront aberration term mathematically representing a characteristic of a wavefront aberration, wherein the set of test patterns produces a substantially linear response with respect to the variation of the predefined wavefront aberration term.

The scope of this invention covers generating tailored (linear or non-linear) response to any arbitrary orders of wavefront aberration terms, such as the Zernikes. The linearity/particular non-linearity is not necessarily limited to a "window" around any specific wavefront aberration setting, but it is possible to use the lithography response data to bring a projection lithography apparatus to its desired baseline setting. The methodology is suitable where wavefront aberration may need to be reconstructed as a tool to monitor/stabilize performance drift of a projection lithography apparatus. Deviation from a desired response may be measured and quantified as a wafer inspection technique to make a decision whether a batch of wafer should be accepted or discarded. The test patterns are designed to be compatible with conventional wafer inspection tools based on CD measurement or based on scatterometry.

These and other aspects of the present invention, including systems and computer program products corresponding to the above methods, will be apparent to a person skilled in the art in view of the following drawings and detailed description.

BRIEF DESCRIPTION OF THE DRAWINGS

The following description of specific illustrative embodiments of the invention are to be reviewed in conjunction with the accompanying figures, wherein:

FIG. 9 is a schematic diagram of a lithographic projection apparatus to which embodiments of the invention are applicable.

DETAILED DESCRIPTION OF THE EXAMPLE EMBODIMENTS

Figure 1:
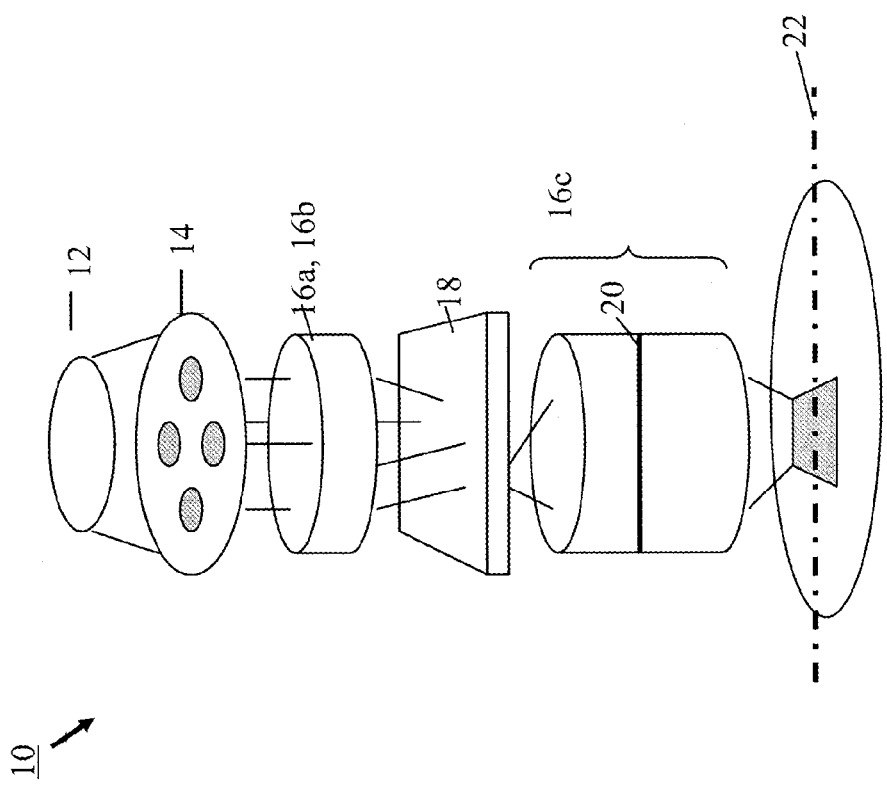
FIG. 1 is a block diagram of various subsystems of a lithography system according to example implementations of the present invention.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In optical imaging systems, including projection lithography systems, to aid in the interpretation of optical metrology results, it is convenient to express measured wavefront data in polynomial form. Zernike polynomials are often used for this purpose since they are made up of terms that are of the same form as the types of wavefront aberrations frequently observed in optical systems. Zernike coefficients provide a complete and orthogonal basis to describe the aberration. Details about Zernike polynomials may be found at Chapter I of the book, titled, "Basic Wavefront Aberration Theory for Optical Metrology" pp-28-39, by James C. Wyant and Katherine Creath, Applied Optics and Optical Engineering, vol. XI, Academic Press, (1992) ISBN 0-12-408611-X. In the present application, we use Zernikes as a non-limiting example to demonstrate the methodology and to show that gauges can be designed with linear response for each Zernike coefficients. However, it should be noted that the design methodology can certainly be extended to any other aberration basis with similar characteristics.

The present application describes methods to design gauges with optimized response to wavefront aberration terms (such as aberration Zernikes) used to describe effects of optical subsystems in a lithography system (e.g., projection optics system with tunable knobs) which intentionally introduce aberration into the system. In lithography simulation, it becomes increasingly important to monitor the aberration in order to control the introduced aberration accurately. The desired response to the variation of aberration terms may be linear, but persons skilled in the art will appreciate that this application is not limited to generating linear responses only. The methods disclosed herein are universal enough to generate any kind of tailored response, linear, or non-linear.

Some simulation software adopt non-linear optimization processes to generate non-linear gauge responses. However, in certain situations, linear response to lithography process parameters become especially attractive: Non-linear optimization approaches are usually iterative approaches, which are time consuming. On the contrary, if the desired response is linear, then a simple matrix operation may be adopted. Linear approaches are also more immune to local optimum problem.

If the response is a complex non-linear one, then we cannot guarantee that the optimization approach finds the truly global solution. In addition, selecting the right step size for the optimization process becomes an issue. If the step size used in the optimization is not good, then the optimization may have oscillation or very slow convergence. Such problems are irrelevant if the response is linear. Non-linear optimization may make the gauge selection process relatively difficult. It's desired to select good gauges with large sensitivity in the calibration or waveform reconstruction process to improve calibration accuracy and convergence speed, however, when the response is non-linear, we may end up with the following scenario: first, good gauges with large sensitivity around the nominal condition are chosen. Unfortunately, in the real scanner operation, if the condition is different from the nominal condition, the chosen 'good' gauges show rather poor sensitivity. Linear response leads to a uniform response from the gauges. For these reasons, in some applications, such as, applications where the temporal drift of a scanner is brought back to a reference baseline performance, or, in tunable projection optics applications, where real-time wavefront reconstruction can be useful, linear-response gauges are preferred. Further, since delta measurements (i.e. difference between response parameters, rather than absolute values of the response parameters) as the metric for calibration, choosing linear response may reduce some common error source in the measurements, which may improve the calibration accuracy further.

It is to be noted that the aberration Zernike (or other polynomial coefficients) may mix, introducing some non-linearity to the response. However, in most of the practical scenarios, Zernike mixing is not significant. Furthermore, a simple set of linear equations may be solved to reconstruct all the Zernikes, even if the Zernike terms mix with each other.

Additionally, it is to be noted that instead of separate gauges/test patterns added to the chip-design layout, lithographers may use a set of test patterns from the actual target chip (layout may be provided by the customer) that are designated to be used as test patterns. This way some real estate may be saved in the design layout. However, in order to achieve a desired linear (or otherwise tailored) response, gauges may need to be designed in pairs, each pair comprising two test patterns which are symmetric to each other. With arbitrary customer patterns, this might not be possible. Still, persons skilled in the art will appreciate that the scope of the invention is not limited to specially designed test patterns.

A. General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin ($\Theta_{max}$).

Figure 2:
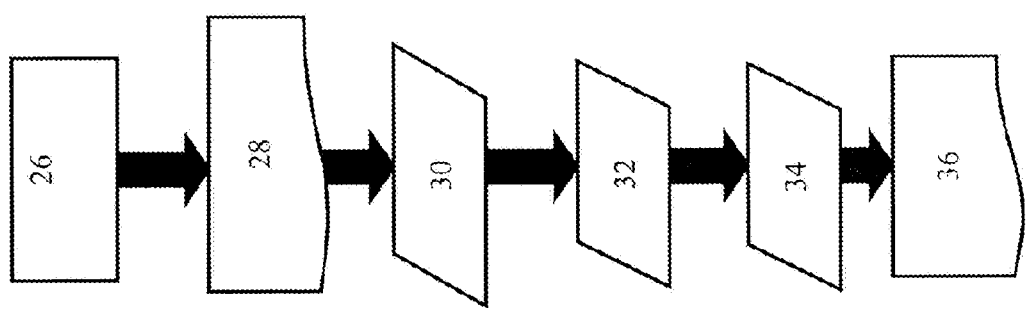
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design layout; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

B. Example Methods of the Present Invention

In co-owned co-pending U.S. patent application Ser. No. 13/128,630, titled, "Methods and Systems for Parameter-Sensitive and Orthogonal Gauge Design for Lithography Calibration," a methodology has been disclosed to design gauges to maximize sensitivities for each lithography parameter to improve the robustness against random errors such as measurement inaccuracies. In this application, similar approach is used to maximize the sensitivities for Zernikes. However, the typical highly non-linear Zernikes' effect still makes it difficult to find the accurate Zernike values. An added feature of the methodology is to design gauges comprising a pair of test patterns, such that the sensitivity of the difference between two measured CD (Critical Dimension) values from the two patterns is maximized against a lithography process parameter variation. Such CD (or other response parameter) difference will eliminate the common error sources, such as measurement bias. Further, the two patterns are designed in a special way that the resulting CD difference also eliminates the all the certain order (such as, even order) response against Zernike variation. Thus the gauges have approximately linear response for each Zernike coefficients, which leads to efficient Zernike monitoring.

The aberration monitoring approach proposed in the article "Accurate Measurement of Spherical and Astigmatic Aberrations by a Phase Shift Grating Reticle", by H. Nomura, Japan. J. Appl. Phys. Vol. 40 (2001) pp. 6316-6322, aberration is monitored through symmetric and rotated repeated Phase-Shift-Gratings. That approach requires Phase-Shift-Mask and has additional constraints on pitch and adjustable mask parameters. Further, it requires illumination source with a limited fill factor, which is not always practical. The present approach does not require Phase-Shift-Mask, and has much less constraints on pitch, adjustable mask parameters, and illumination source.

It has been seen that CD generally responds to Zernikes in quadratic forms. Using paired structures that respond to Zernikes with the same quadratic coefficients, it can be ensured that difference in CD will be linear in Zernikes.

Different test pattern structures can be designed for tailored response to different aberration Zernike terms. For example, mirror symmetric structures can be used for Zernikes representing coma terms; 90 degree rotated structures can be used for Zernikes representing astigmatism terms, etc. In fact, such design works for all Zernike terms except the spherical terms. The basic idea is to design two or more test patterns (with possibly different tilting angles), even though their quadratic response may be different. Designers can use different weighting for each pattern, and the linear combination of the CDs will cancel out the quadratic response, which leads to a linear response.

Figure 3:
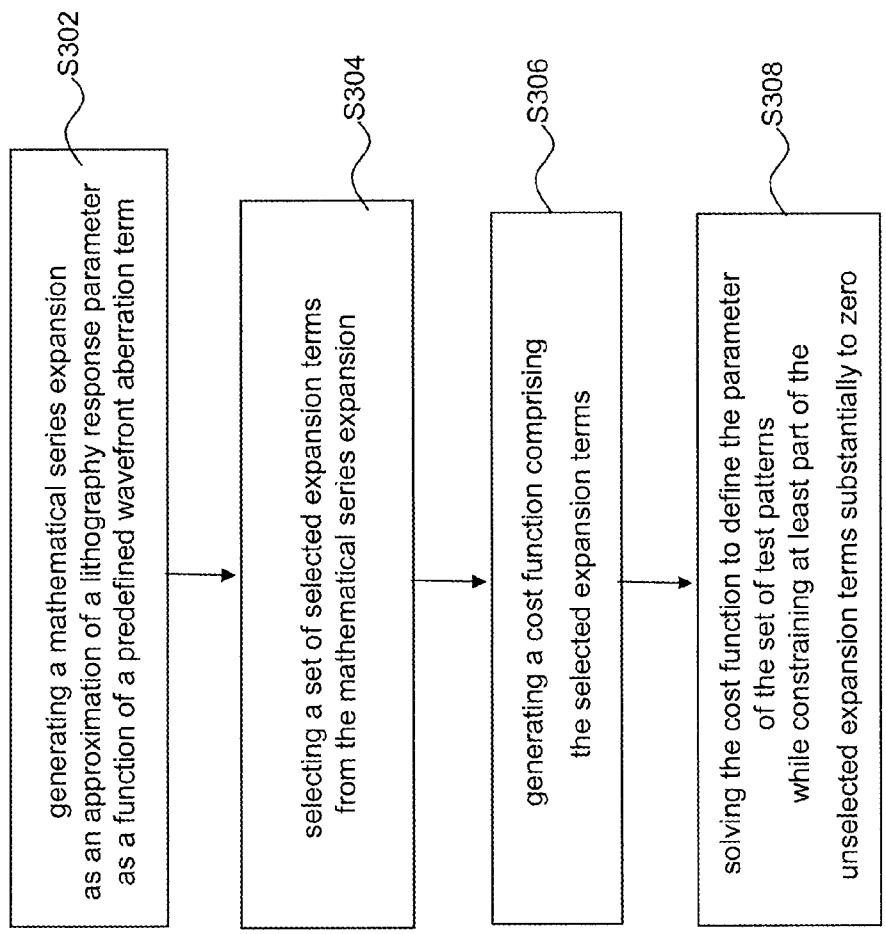
FIG. 3 is a flow diagram illustrating some key features of a test pattern design method, according to an embodiment of the present invention.

FIG. 3 shows a flowchart showing some key steps of the methodology described in this application. In step S302, a mathematical series expansion is generated as an approximation of the lithography response parameter as a function of a waveform aberration term. The wavefront aberration term may be Zernike coefficients. In step S304, a set of expansion terms are selected from the mathematical series expansion. In step S306, a cost function is generated that comprises the selected expansion terms. In step S308, the cost function is solved to define the parameter of the set of test patterns while constraining at least part of the unselected expansion terms substantially to zero.

As an example, let us assume that there are two patterns $P_1$ and $P_2$, and their CDs can be well approximated as quadratic polynomials of the Zernike term (steps S302 and S304):

$$CD_1 = CD_{01} + a_1 z_n + b_1 z_n^2$$

$$CD_2 = CD_{02} + a_2 z_n + b_2 z_n^2 \quad \text{(Eq. A)}$$

where $CD_1$ and $CD_2$ are the CDs of patterns $P_1$ and $P_2$, respectively, $CD_{01}$ and $CD_{02}$ are referred as the fitted nominal condition CDs, $a_1$ and $a_2$ are referred as the linear sensitivities, and $b_1$ and $b_2$ are referred as the quadratic sensitivities. Suppose we use weights $w_1$ and $w_2$ for the two patterns so that we monitor the Zernike variation using the metric:

$$CD = w_1 CD_1 + w_2 CD_2 \quad \text{(Eq. B)}$$

Then the problem becomes identifying two constants $w_1$ and $w_2$, and two pattern $P_1$ and $P_2$, to maximize an example cost function (CF) (step S306):

$$CF = \frac{|w_1 a_1 + w_2 a_2|}{\sqrt{w_1^2 + w_2^2}} \quad \text{(Eq. C)}$$

under the constraint that $w_1 b_1 + w_2 b_2 = 0$ (step S308).

Figure 4:
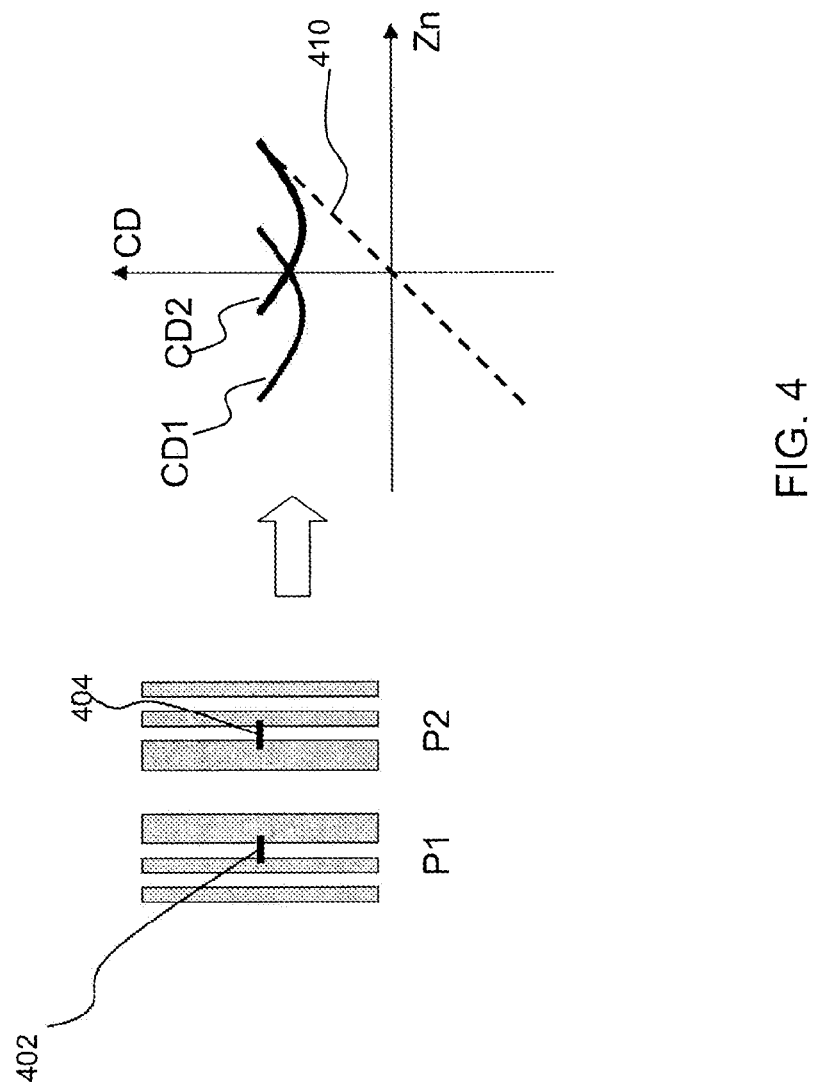
FIG. 4 schematically illustrates an example of a gauge comprising a pair of test patterns with a combined effective linear response, according to an embodiment of the present invention.

FIG. 4 shows two patterns P1 and P2 (each comprising a series of lines and bars), with two CDs (CD1 402 and CD2 404). The CD1 and CD2 terms are plotted against a Zernike term $Z_n$, and they are individually quadratic. However, the combined response 410, i.e. the term CD in Eq. C, is substantially linear. For different Zernike terms (i.e. when n varies in $Z_n$), the slope of the response 410 may vary, but the response remains more or less linear.

We can apply the general non-linear methods, such as Gaussian-Newton method, Levenberg-Marquardt algorithm, gradient descent algorithm, simulated annealing, genetic algorithm, and etc., to solve this optimization problem, which leads to a general solution for arbitrary Zernike term and arbitrary illumination source shape.

We can also simplify the solution in the following example way: a) Identify pattern $P_1$ with the maximum possible linear sensitivity $a_1$ under the constraint that $b_1 \geq 0$; b) Identify pattern $P_2$ with the minimum possible linear sensitivity (it may be a negative value) $a_2$ under the constraint that $b_2 \geq 0$; c) Identify pattern $P_3$ with the maximum possible linear sensitivity $a_3$ under the constraint that $b_3 < 0$; d) Identify pattern $P_4$ with the minimum possible linear sensitivity (it may be a negative value) $a_4$ under the constraint that $b_4 < 0$; e) For patterns $P_1$ and $P_2$, if $b_1 = 0$, then pattern $P_1$ alone is a pattern with linear response, and we can use this single pattern as a candidate for the final design with $CD_1$ as the metric to monitor the Zernike variation; similarly, if $b_2 = 0$, we can use pattern $P_2$ as a candidate for the final design with $CD_2$ as the metric to monitor the Zernike variation; otherwise, both $b_1$ and $b_2$ are non-zero, we assume without loss of generality that $|b_1| \geq |b_2|$, then we use the pattern pair composed of $(P_1, P_2)$ as a candidate with $$-\frac{b_2}{b_1} CD_1 + CD_2$$

as the linear metric to monitor the Zernike variation; f) Repeat step e) for any remaining pairs among patterns $P_1, P_2, P_3$, and $P_4$, and use the pattern or pattern pairs with the largest linear sensitivity as our gauge.

Note that when the illumination source shape has certain symmetry as mentioned in previous sections, then $P_1$ and $P_2$ may happen to be symmetric with same quadratic sensitivities but opposite linear sensitivities. Thus this method can be deemed as more general than the previous one.

As a background of aberration expressed as Zernike terms, we briefly discuss Hopkins theory and transmission cross coefficients (TCC) here. The aerial image AI can be expressed as $$AI(x, y) = $$

$$\sum_{k_1, k_2} \left| A(k_1, k_2) \sum_{k_1', k_2'} M(k_1' - k_1, k_2' - k_2) L(k_1', k_2') \exp(-jk_1'x - jk_2'y) \right|^2 =$$

$$\sum_{k_1, k_2} \left[ \begin{array}{c} A(k_1, k_2)^2 \\ M(k_1' - k_1, k_2' - k_2) L(k_1', k_2') \\ \sum_{k_1', k_2'} \sum_{k_1'', k_2''} M^*(k_1'' - k_1, k_2'' - k_2) L^*(k_1'', k_2'') \\ \exp(-j(k_1' - k_1'')x - j(k_2' - k_2'')y) \end{array} \right] =$$

$$\sum_{k_1', k_2', k_1'', k_2''} \left[ \begin{array}{c} \left[ \sum_{k_1, k_2} A(k_1, k_2)^2 L(k_1 + k_1', k_2 + k_2') L^*(k_1 + k_1'', k_2 + k_2'') \right] \\ M(k_1', k_2') M^*(k_1'', k_2'') \exp(-j(k_1' - k_1'')x - j(k_2' - k_2'')y) \end{array} \right] =$$

$$\sum_{k_1', k_2', k_1'', k_2''} \left[ \begin{array}{c} TCC_{k_1', k_2', k_1'', k_2''} M(k_1', k_2') M^*(k_1'', k_2'') \\ \exp(-j(k_1' - k_1'')x - j(k_2' - k_2'')y) \end{array} \right] \text{ wherein}$$

$$TCC_{k_1', k_2', k_1'', k_2''} \equiv \sum_{k_1, k_2} A(k_1, k_2)^2 L(k_1 + k_1', k_2 + k_2') L^*(k_1 + k_1'', k_2 + k_2'')$$

AI(x,y) is the aerial image in the space domain. $A(k_1,k_2)$ is the source amplitude from point k on the source pupil plane. $L(k_1, k_2)$ is the projection optics amplitude and phase function for point $(k_1, k_2)$ on the lens pupil plane, also referred to as "lens pupil image" in this disclosure. The projection optics function in the space domain represents distortions caused by the projection optics to the light passing through the projection optics (e.g., distortions in amplitude, phase or both) as a function of location. $M(k_1,k_2)$ is the mask function (i.e., design layout function) in the spatial frequency domain, and can be obtained from the mask function in the space domain by a Fourier transform. The mask function in the space domain represents distortions caused by the mask to the light passing through the mask (e.g., distortions in amplitude, phase or both) as a function of location. More details can be found in, for example, in U.S. Pat. No. 7,587,704, which is incorporated by reference in its entirety. A function in the space domain can be transformed to a corresponding function in the spatial frequency domain and vice versa by Fourier transform. Here, x and k are both vectors. It is further noted that although in the given example, the equations above is derived from a scalar imaging model, this formalism can also be extended to a vector imaging model, where TE and TM or other polarized light components are summed separately. $TCC_{k_1',k_2',k_1'',k_2''}$ can be viewed as a matrix, which includes optical properties of the lithographic projection apparatus excluding the mask. Also note that the TCC matrix is Hermitian, i.e., $TCC_{k_1',k_2',k_1'',k_2''} = TCC^*_{k_1'',k_2'',k_1',k_2'}$.

Computation of the aerial image using the above equations can be simplified if only dominant eigenvalues of $TCC_{k_1',k_2',k_1'',k_2''}$ are used. Specifically, when $TCC_{k_1',k_2',k_1'',k_2''}$ is diagonalized and on the largest R eigenvalues are retained, the $TCC_{k_1',k_2',k_1'',k_2''}$ can be approximated as:

$$TCC_{k_1',k_2',k_1'',k_2''} = \sum_{r=1}^{R} \lambda_r \phi_r(k_1', k_2') \phi_r^*(k_1'', k_2'')$$

wherein $\lambda_r$ (r=1,K, R) are the R largest eigenvalues and $\phi_r$ is the eigenvector corresponding to the eigenvalue $\lambda_r$.

In a practical lithographic projection apparatus, for Zernike coefficient $z_n$, $TCC_{k_1',k_2',k_1'',k_2''}$ can be well approximated as $$TCC_{k_1',k_2',k_1'',k_2''}(z_n) \approx TCC_{k_1',k_2',k_1'',k_2''}(z_{n0}) + a_{TCC,n,k_1',k_2',k_1'',k_2''}(z_n - z_{n0}) + b_{TCC,n,k_1',k_2',k_1'',k_2''}(z_n - z_{n0})^2$$

$TCC_{k_1',k_2',k_1'',k_2''}(z_{n0})$, $a_{TCC,n,k_1',k_2',k_1'',k_2''}$ and $b_{TCC,n,k_1',k_2',k_1'',k_2''}$ are independent from $Z_n$. Therefore, once $TCC_{k_1',k_2',k_1'',k_2''}(z_{n0})$, $a_{TCC,n,k_1',k_2',k_1'',k_2''}$ and $b_{TCC,n,k_1',k_2',k_1'',k_2''}$ are computed, $TCC_{k_1',k_2',k_1'',k_2''}(Z_n)$ as a function of $z_n$ is known. $TCC_{k_1',k_2',k_1'',k_2''}(z_{n0})$ can be directly calculated from the nominal condition $z_n=z_{n0}$. The coefficients $a_{TCC,n,k_1',k_2',k_1'',k_2''}$, and $b_{TCC,n,k_1',k_2',k_1'',k_2''}$ can be fitted from a set of known values of $z_n$ or be derived as partial derivatives, details of which can be found in commonly assigned U.S. patent application Ser. No. 12/315,849, disclosure of which is hereby incorporated by reference in its entirety.

Once $TCC_{k_1',k_2',k_1'',k_2''}(z_{n0})$, $a_{TCC,n,k_1',k_2',k_1'',k_2''}$ and $b_{TCC,n,k_1',k_2',k_1'',k_2''}$ are computed, the computation of the aerial image AI can be further simplified using an expansion with respect to $z_n$:

$$AI(z_n) \approx AI(z_{n0}) + a_{1,n}(z_n - z_{n0}) + b_{1,n}(z_n - z_{n0})^2$$

Note that $AI(z_{n0})$, $a_{1,n}$, and $b_{1,n}$ are referred to as pseudo-aerial images, which can be computed from the mask image and $TCC_{k_1',k_2',k_1'',k_2''}(z_{n0})$, $a_{TCC,n,k_1',k_2',k_1'',k_2''}$, and $b_{TCC,n,k_1',k_2',k_1'',k_2''}$, respectively. Further, note that these pseudo-aerial images are all independent of $z_n$.

For optics with lens pupil image $L(k_1, k_2)$ and source pupil image $A(k_1, k_2)$, the resulting TCC is:

$$TCC_{k_1',k_2',k_1'',k_2''} = \sum_{k_1,k_2} [A(k_1,k_2)^2 L(k_1+k_1',k_2+k_2') L^*(k_1+k_1'',k_2+k_2'')]$$

With Zernike coefficient $z_n$, the lens pupil image is expressed as:

$$L(k_1,k_2) = L_0(k_1,k_2) \exp(j(z_n - z_{n0}) P_n(k_1,k_2)),$$

where $L_0(k_1,k_2)$ is the nominal lens pupil image for $z_n = z_{n0}$, and $P_n(k_1, k_2)$ is the kernel image (or Zernike polynomial) corresponding to $z_n$. To simplify the notation, we assume without loss of generality that $z_{n0}=0$, i.e., $L(k_1,k_2)=L_0(k_1,k_2) \exp(jz_n P_n(k_1,k_2))$. The skilled artisan will appreciate that all the discussions thereafter are valid for non-zero $z_{n0}$. We also assume that our nominal condition is set so that all $z_{n0}=0$, therefore $L_0(k_1,k_2)$ is aberration free except that it may have defocus. As a result, $L_0(k_1, k_2)$ is rotational symmetry, i.e., for any two frequency pairs, $(k_1',k_2')$ and $(k_1'',k_2'')$, $L_0(k_1'',k_2'')=L_0(k_1'',k_2'')$ whenever $k_1'^2+k_2'^2=k_1''^2+k_2''^2$.

The TCC fitting process can be viewed as a Taylor expansion, where, $$TCC_{k_1',k_2',k_1'',k_2''}(z_n) = TCC_{k_1',k_2',k_1'',k_2''}(z_n = 0) + \left.\frac{\partial TCC_{k_1',k_2',k_1'',k_2''}}{\partial z_n}\right|_{z_n=0} z_n + \frac{1}{2} \left.\frac{\partial^2 TCC_{k_1',k_2',k_1'',k_2''}}{\partial z_n^2}\right|_{z_n=0} z_n^2$$

This implies that:

$$\begin{aligned}
a_{TCC,n,k_1',k_2',k_1'',k_2''} &= \left.\frac{\partial TCC_{k_1',k_2',k_1'',k_2''}}{\partial z_n}\right|_{z_n=0} \\
&= \frac{\partial}{\partial z_n}\left(\sum_{k_1,k_2}[A(k_1,k_2)^2 L(k_1+k_1',k_2+k_2') \right. \\
&\quad \left. L^*(k_1+k_1'',k_2+k_2'')]\right)|_{z_n=0} \\
&= \frac{\partial}{\partial z_n}\left(\sum_{k_1,k_2}[A(k_1,k_2)^2 L_0(k_1+k_1',k_2+k_2') \right. \\
&\quad L_0^*(k_1+k_1'',k_2+k_2'')\exp \\
&\quad (jz_n(P_n(k_1+k_1',k_2+k_2') - \\
&\quad \left. P_n(k_1+k_1'',k_2+k_2''))])|_{z_n=0}\right. \\
&= \frac{\partial}{\partial z_n}\left(\sum_{k_1,k_2}[A(k_1,k_2)^2 L_0(k_1+k_1',k_2+k_2') \right. \\
&\quad L_0^*(k_1+k_1'',k_2+k_2'')\exp \\
&\quad (jz_n(P_n(k_1+k_1',k_2+k_2') - \\
&\quad \left. P_n(k_1+k_1'',k_2+k_2''))])|_{z_n=0}\right. \\
&= \sum_{k_1,k_2}[j(P_n(k_1+k_1',k_2+k_2') - \\
&\quad P_n(k_1+k_1'',k_2+k_2''))A(k_1,k_2)^2 \\
&\quad L_0(k_1+k_1',k_2+k_2') \\
&\quad L_0^*(k_1+k_1'',k_2+k_2'')]
\end{aligned}$$

$$b_{TCC,n,k_1',k_2',k_1'',k_2''} = \frac{1}{2}\frac{\partial^2 TCC_{k_1',k_2',k_1'',k_2''}}{\partial z_n^2}\bigg|_{z_n=0}$$

$$= \frac{1}{2}\frac{\partial^2}{\partial z_n^2}\bigg(\sum_{k_1,k_2}[A(k_1,k_2)^2 L(k_1+k_1',k_2+k_2')$$

$$L^*(k_1+k_1'',k_2+k_2'')])\bigg|_{z_n=0}$$

$$= \frac{1}{2}\frac{\partial^2}{\partial z_n^2}\bigg(\sum_{k_1,k_2}[A(k_1,k_2)^2 L_0(k_1+k_1',k_2+k_2')$$

$$L_0^*(k_1+k_1'',k_2+k_2'')\exp$$

$$(jz_n(P_n(k_1+k_1',k_2+k_2')-$$

$$P_n(k_1+k_1'',k_2+k_2'')))])\bigg|_{z_n=0}$$

$$= -\frac{1}{2}\sum_{k_1,k_2}[(P_n(k_1+k_1',k_2+k_2')-$$

$$P_n(k_1+k_1'',k_2+k_2''))A(k_1,k_2)^2$$

$$L_0(k_1+k_1',k_2+k_2')$$

$$L_0^*(k_1+k_1'',k_2+k_2'')]$$

It is even more desired to use the difference between the two CDs from symmetric pattern pairs to eliminate all possible common error source, i.e., w1=1, and w2=−1 in Equation B. described earlier.

For such requirement, the mathematical characterization of the problem is: identify two possibly asymmetric patterns to maximize $|a_1-a_2|$ under the constraint that $b_1-b_2=0$. This problem can still be solved using general non-linear optimization methods described earlier.

For certain applications, the number of possible patterns is limited. We can also apply brute force method to search all possible patterns with possible rotations (or sample the patterns with possible rotation angles to speed up the process) and determine the best pattern pair. In particular, we can loop all patterns with all possible rotation angles, and for each pattern and each rotation angle, determine their fitting coefficients (linear term a and quadratic term b) for its CD as described earlier:

$$CD=CD_0+az_n+bz_n^2$$

Then for each (rotated) pattern, all the (rotated) patterns with equal quadratic terms are to be found out. The equality here is in the numerical sense, i.e., two quantities are viewed as equal when the absolute value of their difference does not exceed a certain threshold.

Finally, for any (rotated) pattern pairs with equal quadratic terms, the one which has the maximum linear term difference has to be identified. The result becomes the optimal (rotated) pattern pair to be chosen.

Note that in some cases, we may prefer vertical or horizontal pattern pairs without any rotation. For such cases, we do not need to vary rotation angles.

The previous method leads to Zernike-linear gauges for arbitrary illumination source shape. However, it may lead to two patterns in a single gauge which are drastically different. Sometimes, it is desired to have two symmetric patterns (with some mirror and/or rotation operation) to cancel out common error sources and common non-Zernike signals. We now discuss how to design symmetry pattern pairs for arbitrary illumination source shape. We first assume that we allow some linear combination of the CDs, i.e., for patterns P1 and P2, we use (w1CD1+w2CD2) as the metric, where CD1 and CD2 are the CDs of the two patterns, respectively; and w1 and w2 are the weights.

With two symmetric patterns, we can always view one pattern as a rotation of another (including reflection). Thus the parameters we want to optimize are two constants $w_1$ and $w_2$, one pattern and two rotation angles to maximize $$\frac{|w_1 a_1 + w_2 a_2|}{\sqrt{w_1^2 + w_2^2}}$$

under the constraint that $w_1 b_1 + w_2 b_2 = 0$. Then the problem can be solved using general non-linear optimization methods.

Again, we can simplify the solution as: a) Identifying pattern $P_1$ with the maximum possible linear sensitivity $a_1$. This pattern itself may be tilted, i.e., it may already be rotated by certain angle. B) If $P_1$'s quadratic sensitivity $b_1=0$, then stopping and outputting pattern $P_1$ since its CD already behaves linearly with respect to Zernike variation. c) If $b_1 \neq 0$, identifying the best angle θ so that the rotation of $P_1$ by θ leads to the minimum possible linear sensitivity $a_2$ (which may be negative) among all possible rotations of $P_1$. Note that reflection of the pattern can also be viewed as a rotation. Then we denote the rotation of $P_1$ by θ as pattern $P_2$ and denote its quadratic sensitivity as $b_2$. We output both $P_1$ and $P_2$. d) For aberration monitoring, if $b_1=0$, we measure $P_1$'s CD which is linear with respect to Zernike variation; otherwise, we measure both patterns' CDs, denoted as $CD_1$ and $CD_2$, and use $$-\frac{b_2}{b_1}CD_1 + CD_2$$

as metric to monitor Zernike variation if $|b_1| \geq |b_2|$ or use $$CD_1 - \frac{b_1}{b_2}CD_2$$

as metric to monitor Zernike variation if $|b_1| < |b_2|$.

Again, it is even more desired to use the difference between the two CDs from symmetric pattern pairs to eliminate all possible common error source, i.e., w1=1, and w2=−1.

For such requirement, the mathematical characterization of the problem is: identifying one pattern and two rotation angles to maximize $|a_1-a_2|$ under the constraint that $b_1-b_2=0$. This problem can still be solved using general non-linear optimization methods described earlier.

For certain applications, the number of possible patterns is limited. We can also apply brute force method to search all possible patterns and all possible rotation angles (or sample the patterns and angles to speed up the process) and determine the best rotation angles. In particular, we can loop all patterns with all possible rotation angles, and for each pattern and each rotation angle, determine their fitting coefficients (linear term a and quadratic term b) for its CD as described earlier:

$$CD=CD_0+az_n+bz_n^2$$

Then for each pattern, we need to find out all the angle pairs with equal quadratic term. The equality here is in the numerical sense, i.e., two quantities are viewed as equal when the absolute value of their difference does not exceed certain threshold.

Finally, for any angle pairs with equal quadratic term, identify the one which has the maximum linear term difference. This is the optimal angle pair for this pattern. And the pattern with the largest linear difference from the two optimal rotation angles is the best pattern we are looking for.

In most optical lithography applications, the illumination source shape has certain symmetry. With the knowledge of such symmetry, we can simplify the gauge design further.

In this embodiment, we design two patterns in a specific way according to the illumination source symmetry, so that these two patterns have exactly the same response to $b_{TCC,n,k_1',k_2',k_1'',k_2''}$, i.e., their corresponding $b_{1,n}$ are exactly the same, while their corresponding $a_{1,n}$ are different. As a result, the difference between the two resulting aerial images will be linear with respect to $z_n$ variation. Further, the difference between the resulting aerial image/resist images and thus the difference between the resulting CDs will have linear relationship with $z_n$ variation as well.

Inherent symmetry among the Zernike terms may be exploited to simplify the design methods. We first consider odd mirror symmetric Zernikes.

We consider two types of odd mirror symmetries: $k_1$-odd-symmetry and $k_2$-odd-symmetry. We call a Zernike term $k_1$-odd-symmetric if its Zernike polynomial $P_n(k_1,k_2)$ has the following property: $P_n(k_1,k_2)=-P_n(-k_1,k_2)$ for any $(k_1,k_2)$. The $k_2$-odd-symmetry is defined in a similar way. $k_1$-odd-symmetric Zernike terms are even Zernikes $Z_l^m(\rho,\phi)=R_l^m(\rho)\cos(m\phi)$ with odd m (for example, Z2, Z7, and etc.) and odd Zernikes $Z_l^{-m}(\rho,\phi)=R_l^m(\rho)\sin(m\phi)$ with even m (for example, Z6, Z13, and etc.). $k_2$-odd-symmetric Zernike terms are all the odd Zernikes $Z_l^{-m}(\rho,\phi)=R_l^m(\rho)\sin(m\phi)$ (for example, Z3, Z8, and etc.). Note that some Zernike terms can be both $k_1$-odd-symmetric and $k_2$-odd-symmetric simultaneously, i.e., those odd Zernikes $Z_l^{-m}(\rho,\phi)=R_l^m(\rho)\sin(m\phi)$ with even m.

We first consider gauge design for $k_1$-odd-symmetric terms. Suppose the mask images of the two patterns in the gauge are $m_1(x, y)$ and $m_2(x, y)$ in spatial domain. If these two patterns are symmetric with respect to the y-axis, i.e., $m_2(x, y)=m_1(-x, y)$. Then their Fourier transforms, i.e., the mask images in frequency domain, have the following relationship: $M_2(k_1,k_2)=M_1(-k_1, k_2)$. So for any TCC, the difference between their Aerial Images (AIs) (since the second pattern is a reflection of the first one, we will look at the reflection of the second AI so that each point on the second AI matches the corresponding point on the first one) is:

$$AI_1(x, y) - AI_2(-x, y) = \sum_{k_1',k_2',k_1'',k_2''} \left[TCC_{k_1',k_2',k_1'',k_2''}\right.$$

$$M_1(k_1', k_2')M_1^*(k_1'', k_2'')\exp(-j(k_1'-k_1'')x - j(k_2'-k_2'')y)\bigg] -$$

$$\sum_{k_1',k_2',k_1'',k_2''} \left[TCC_{k_1',k_2',k_1'',k_2''}M_2(k_1', k_2')M_2^*(k_1'', k_2'')\right.$$

$$\exp(j(k_1'-k_1'')x - j(k_2'-k_2'')y)\bigg] =$$

$$\sum_{k_1',k_2',k_1'',k_2''} \left[TCC_{k_1',k_2',k_1'',k_2''}M_1(k_1', k_2')M_1^*(k_1'', k_2'')\right.$$

$$\exp(-j(k_1'-k_1'')x - j(k_2'-k_2'')y)\bigg] - \sum_{k_1',k_2',k_1'',k_2''} \left[TCC_{k_1',k_2',k_1'',k_2''}\right.$$

$$M_1(-k_1', k_2')M_1^*(-k_1'', k_2'')\exp(j(k_1'-k_1'')x - j(k_2'-k_2'')y)\bigg] =$$

$$\sum_{k_1',k_2',k_1'',k_2''} \left[TCC_{k_1',k_2',k_1'',k_2''}M_1(k_1', k_2')M_1^*(k_1'', k_2'')\right.$$

$$\exp(-j(k_1'-k_1'')x - j(k_2'-k_2'')y)\bigg] - \sum_{k_1',k_2',k_1'',k_2''} \left[TCC_{-k_1',k_2',-k_1'',k_2''}\right.$$

$$M_1(k_1', k_2')M_1^*(k_1'', k_2'')\exp(-j(k_1'-k_1'')x - j(k_2'-k_2'')y)\bigg] =$$

$$\sum_{k_1',k_2',k_1'',k_2''} \left[(TCC_{k_1',k_2',k_1'',k_2''} - TCC_{-k_1',k_2',-k_1'',k_2''})M_1(k_1', k_2')\right.$$

$$M_1^*(k_1'', k_2'')\exp(-j(k_1'-k_1'')x - j(k_2'-k_2'')y)\bigg]$$

We then only need look at the TCC difference, i.e., $TCC_{k_1',k_2',k_1'',k_2''} - TCC_{-k_1',k_2',-k_1'',k_2''}$.

If we are looking at the difference from TCC matrix $b_{TCC,n,k_1',k_2',k_1'',k_2''}$, then $$TCC_{b,k_1',k_2',k_1'',k_2''} - TCC_{b,-k_1',k_2',-k_1'',k_2''} =$$

$$-\frac{1}{2}\sum_{k_1,k_2}[(P_n(k_1+k_1', k_2+k_2') - P_n(k_1+k_1'', k_2+k_2''))^2$$

$$A(k_1, k_2)^2 L_0(k_1+k_1', k_2+k_2')L_0^*(k_1+k_1'', k_2+k_2'')] +$$

$$\frac{1}{2}\sum_{k_1,k_2}[(P_n(k_1-k_1', k_2+k_2') - P_n(k_1-k_1'', k_2+k_2''))^2$$

$$A(k_1, k_2)^2 L_0(k_1-k_1', k_2+k_2')L_0^*(k_1-k_1'', k_2+k_2'')] =$$

$$-\frac{1}{2}\sum_{k_1,k_2}[(P_n(k_1+k_1', k_2+k_2') - P_n(k_1+k_1'', k_2+k_2''))^2$$

$$A(k_1, k_2)^2 L_0(k_1+k_1', k_2+k_2')L_0'(k_1+k_1', k_2+k_2'')] +$$

$$\frac{1}{2}\sum_{k_1,k_2}[(P_n(-k_1-k_1', k_2+k_2') - P_n(-k_1-k_1'', k_2+k_2''))^2$$

$$A(-k_1, k_2)^2 L_0(-k_1-k_1', k_2+k_2')L_0^*(-k_1-k_1'', k_2+k_2'')]$$

The last equality follows by the change of variable $k_1$ to $-k_1$ in the second summation.

We next consider 1st and higher order Zernikes.

We here consider even Zernikes $Z_l^m(\rho,\phi)=R_l^m(\rho)\cos(m\phi)$ and odd Zernikes $Z_l^{-m}(\rho,\phi)=R_l^m(\rho)\sin(m\phi)$ with $m \geq 1$. Note that for all these Zernikes, $$P_n(k_1, k_2) = -P_n\left(k_1\cos\left(\frac{\pi}{m}\right) + k_2\sin\left(\frac{\pi}{m}\right), -k_1\sin\left(\frac{\pi}{m}\right) + k_2\cos\left(\frac{\pi}{m}\right)\right)$$

for any $(k_1, k_2)$.

Suppose the mask images of the two patterns in the gauge are $m_1(x, y)$ and $m_2(x, y)$ in spatial domain. If the second pattern is the first rotated by an angle of $\pi/m$ counter-clockwise, i.e., $$m_2(x, y) = m_1\left(x\cos\left(\frac{\pi}{m}\right) - y\sin\left(\frac{\pi}{m}\right), x\sin\left(\frac{\pi}{m}\right) + y\cos\left(\frac{\pi}{m}\right)\right).$$

Then their Fourier transforms, i.e., the mask images in frequency domain, have the following relationship:

$$M_2(k_1, k_2) = M_1\left(k_1\cos\left(\frac{\pi}{m}\right) - k_2\sin\left(\frac{\pi}{m}\right), k_1\sin\left(\frac{\pi}{m}\right) + k_2\cos\left(\frac{\pi}{m}\right)\right).$$

So for any TCC, the difference between their Aerial Images (AIs) (again, since the second pattern is a rotation of the first one under a certain transformation, we will look at the second AI rotated back so that each point on the second AI matches the corresponding point.

In the previous sections, we discussed how to arrange the two patterns so that the difference between their CDs is linear to the Zernike variation. However, it is important that we maximize the linear response, to improve the robustness against error, such as random measure error. From the previous discussions, a 2nd test pattern can be derived from transformation of a 1st pattern, therefore, we only need to design the 1st pattern to maximize the CD response to the pseudo-TCC. Either 1D (line/space patterns with 1D assist features) or 2D patterns (complex 2D patterns) can be used to maximize the linear response. The linear response can be viewed as a cost function, and we have designed specific gauges to maximize the cost function under certain constraints, such as MRC (Mask Rule Checking) constraints, ILS (inverse log slope), resist image contrast, DOF (Depth of Focus) etc. Note that we use the difference of CDs for the pseudo-TCC cost function. As non-limiting examples for the cost function, there exists other possible cost functions, such as, best focus shift, pattern shift, and etc.

Because of their robustness to many types of error and simplicity to use, 1D gauges are of particular interest. Therefore, we use 1D gauge design as an example to illustrate the process. Each 1D gauge can be determine by certain parameters, such as, pitch (P), main pattern CD (CD) (the main pattern can be a line pattern, or the space between two line patterns, thus the main pattern CD can be both line width or spacing between two line patterns, depending on which one has larger linear response), assist feature placement (AF), tilting angle (q), etc. It is noted that the best 1D gauge may be neither vertical nor horizontal, but a tilted one.

The problem of finding the best gauges can be view as a mathematical problem of optimizing the cost function. Under certain constraints, such as MRC (Mask Rule Checking) constraints, ILS (inverse log slope), resist image contrast, DOF (Depth of Focus), this problem can be solved using methodologies mentioned previously. Also, person skilled in the art will recognize that even though we are using 1D gauges to exemplify the parameters, this cost function formula is sufficient general to include the cost function of 2D gauge parameters in order to cover the 2D gauge design.

Figure 5:
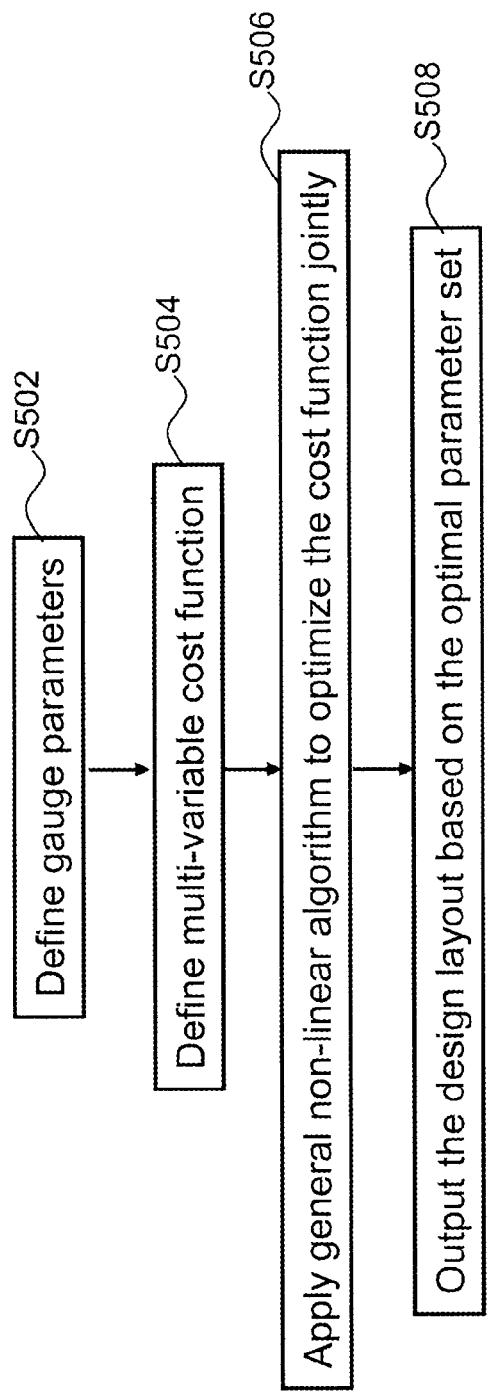
FIGS. 5-7 show examples of test pattern design optimization methods, according to embodiments of the present invention.
Figure 6:
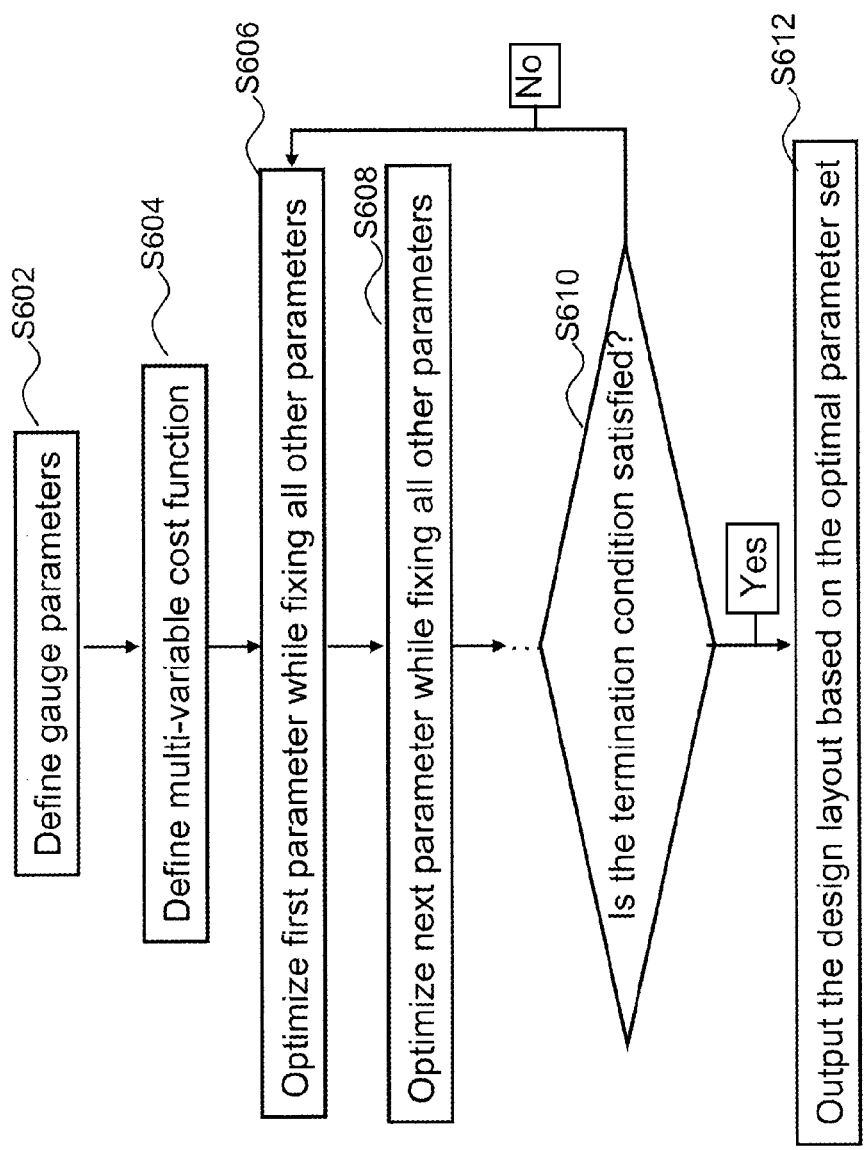
Figure 7:
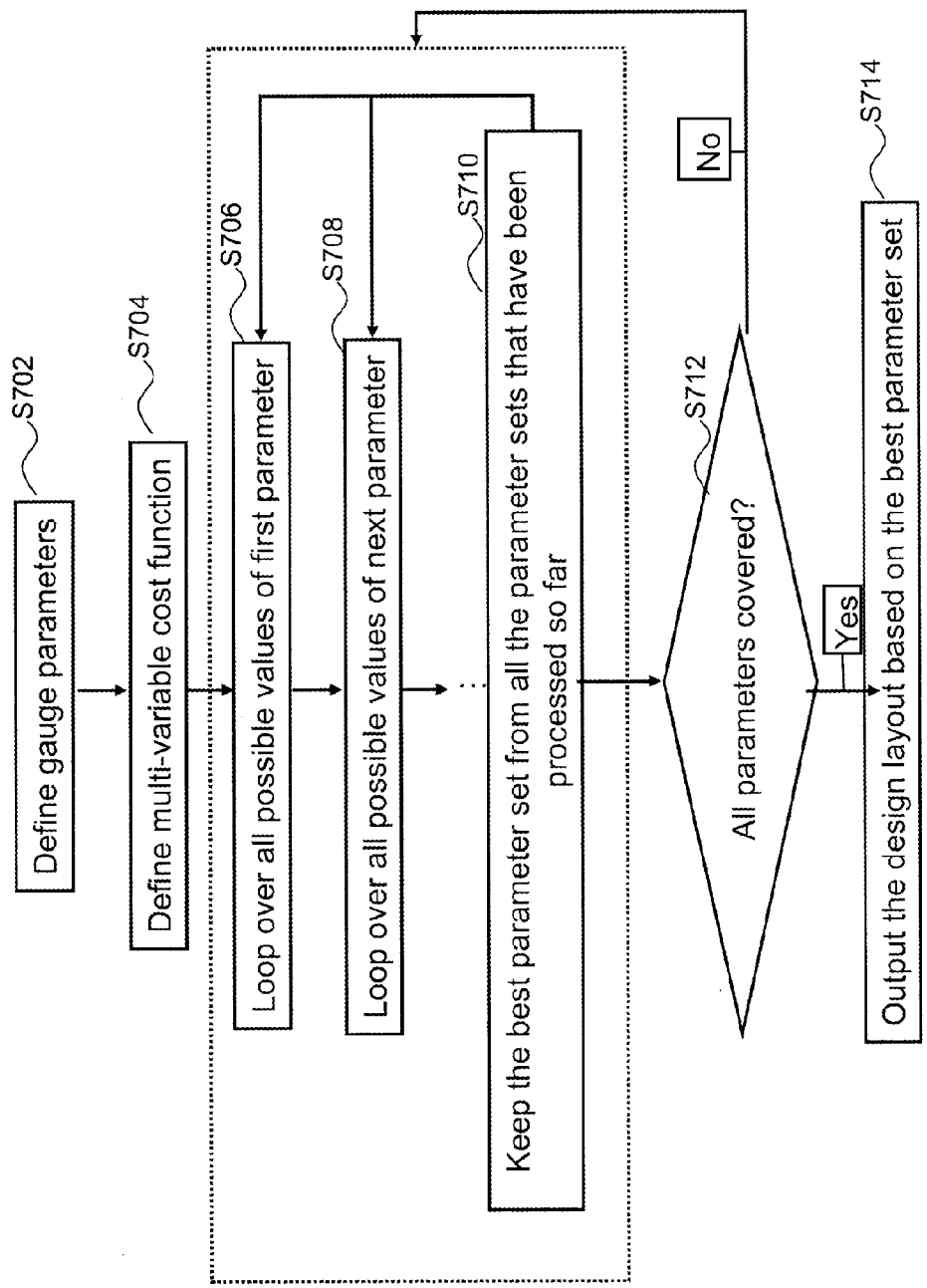

It should be noted that these parameters may be optimized jointly or alternatively. They can also be optimized using brute force search, or they can be optimized in certain hybrid way: some are optimized using brute force search, some are optimized jointly, and some are optimized alternatively. FIGS. 5-7 show the three exemplary flowcharts.

The flowchart in FIG. 5 shows a joint optimization method. The flowchart begins with step S502, where gauge parameters are defined. The parameters may be a single parameter or a set (p1, p2, ... ). In step S504, a multi-variable cost function is defined including the parameters (p1, p2 ... ). In step S506, general non-linear algorithm is applied to achieve joint optimization of the parameters. In step S508, the optimal parameter set is selected as the result of the joint optimization, and the design layout is outputted with test patterns corresponding to the selected parameters.

The flowchart in FIG. 6 shows an alternative optimization method. The flowchart begins with step S602, where gauge parameters are defined. The parameters may be a single parameter or a set (p1, p2, ... ). In step S604, a multi-variable cost function is defined including the parameters (p1, p2 ... ). In steps S606-S610, an alternative optimization algorithm is applied. For example, in step S606, a first parameter p1 is optimized when all other parameters are kept fixed. In step S608, a second parameter p2 is optimized when all other parameters are kept fixed. This way, all the parameters are successively optimized, until a predefined termination condition is satisfied in step S610. Examples of the predefined termination condition are: a maximum number of iterations is achieved, a predefined time limit has expired, the cost function has converged, an acceptable linear response has been achieved, etc. In step S612, the optimal parameter set is selected as the result of the joint optimization, and the design layout is outputted with test patterns corresponding to the selected parameters.

The flowchart in FIG. 7 shows a brute force optimization method. The flowchart begins with step S702, where gauge parameters are defined. The parameters may be a single parameter or a set (p1, p2, ... ). In step S704, a multi-variable cost function is defined including the parameters (p1, p2 ... ). In steps S706-S710, a brute force optimization algorithm is applied. For example, in step S706, a response value is calculated looping over all possible values of the first parameter p1. In step S708, a response value is calculated looping over all possible values of the second parameter p2. This way, all the parameters are successively scanned, and the best parameter set from all the parameter sets have been stored from all the iterations. In step S712, it is checked whether all the parameters are covered. In step S714, the optimal parameter set is selected as the result of the joint optimization, and the design layout is outputted with test patterns corresponding to the selected parameters.

It should also be noted that the optimization for some parameters may have analytical or fast solutions, which becomes particularly helpful if we optimize the parameters alternatively. Also for certain illumination source shape, such as annular source, we can get analytical solution for the tilting angle for each Zernike term.

We have discussed how to design linear gauges for non-Spherical Zernike terms by using two symmetric patterns. However, for Spherical Zernike terms, because they are rotational symmetric, no matter how the Zernike polynomials are rotated or reflected, there is no odd symmetry. Therefore, for these terms, we may use different cost functions or metrics to achieve linearity. We next discuss the linear relationship between the focus shift and Zernike terms.

To use focus shift as a cost function, for mask image m(x, y), the aerial image is expressed as:

$$AI(x, y) = \sum_{k_1, k_2} \left[ A(k_1, k_2)^2 \left[ \sum_{k_1' k_2'} \sum_{k_1'' k_2''} \begin{array}{c} M(k_1' - k_1, k_2' - k_2)L(k_1', k_2') \\ M^*(k_1'' - k_1, k_2'' - k_2)L^*(k_1'', k_2'') \\ \exp(-j(k_1' - k_1'')x - j(k_2' - k_2'')y) \end{array} \right] \right]$$

Now, if we consider both focus f and Zernike term $z_n$, then the lens pupil image becomes $L(k_1,k_2)=L_0(k_1,k_2)\exp(j(f-f_0)P_f(k_1,k_2)+j(z_n-z_{n0})P_n(k_1,k_2))$, where $f_0$ is the best focus when $z_n=z_{n0}$, $L_0(k_1,k_2)$ is the nominal lens pupil image for $f=f_0$ and $z_n=z_{n0}$, $P_f(k_1,k_2)$ is the kernel image for focus, and $P_n(k_1, k_2)$ is the kernel image (or Zernike polynomial) corresponding to $z_n$.

We can again use $2^{nd}$ order Taylor expansion to well approximate the aerial image, which leads to a $2_{nd}$ order polynomial of focus and Zernike term $z_n$:

$$AI(x, y) = AI_{f_0, z_{n0}}(x, y) + a_{f_0, z_{n0}}(x, y)(f - f_0) + \\ b_{f_0, z_{n0}}(x, y)(z_n - z_{n0}) + c_{f_0, z_{n0}}(x, y)(f - f_0)^2 + \\ d_{f_0, z_{n0}}(x, y)(f - f_0)(z_n - z_{n0}) + e_{f_0, z_{n0}}(x, y)(z_n - z_{n0})^2$$

where the coefficients are constants independent of focus f and Zernike term $z_n$, defined as $$AI_{f_0,z_{n0}}(x, y) = \sum_{k_1,k_2} \left[ \begin{array}{c} A(k_1, k_2)^2 \\ \left[ \sum_{k'_1,k'_2} \sum_{k''_1,k''_2} \begin{array}{c} M(k'_1 - k_1, k'_2 - k_2)L_0(k'_1, k'_2) \\ M^*(k''_1 - k_1, k''_2 - k_2) \\ L_0^*(k''_1, k''_2)\exp(-j(k'_1 - k''_1)x - j(k'_2 - k''_2)y) \end{array} \right] \end{array} \right]$$

$$a_{f_0,z_{n0}}(x, y) = \frac{\partial AI(x, y)}{\partial f}\bigg|_{f=f_0, z=z_{n0}}$$

$$b_{f_0,z_{n0}}(x, y) = \frac{\partial AI(x, y)}{\partial z_n}\bigg|_{f=f_0, z_n=z_{n0}}$$

$$c_{f_0,z_{n0}}(x, y) = \frac{\partial^2 AI(x, y)}{\partial f^2}\bigg|_{f=f_0, z=z_{n0}}$$

$$d_{f_0,z_{n0}}(x, y) = \frac{\partial^2 AI(x, y)}{\partial f \partial z_n}\bigg|_{f=f_0, z=z_{n0}}$$

$$e_{f_0,z_{n0}}(x, y) = \frac{\partial^2 AI(x, y)}{\partial z_n^2}\bigg|_{f=f_0, z=z_{n0}}$$

We now study the relationship between the best focus and the Zernike term. The best focus can be determined by set the AI's partial derivative with respect to focus to 0, then the best focus is:

$$f^* = f_0 + \frac{a_{f_0,z_{n0}}(x, y) + d_{f_0,z_{n0}}(x, y)(z_n - z_{n0})}{2c_{f_0,z_{n0}}}$$

which is linear with respect to $z_n$ variation.

Note that $f_0$ is the best focus when $z_n = z_{n0}$, which implies that $$a_{f_0,z_{n0}}(x, y) = \frac{\partial AI(x, y)}{\partial f}\bigg|_{f=f_0, z=z_{n0}} = 0.$$

However, whether it is zero or not does not affect the linear relationship. Since the previous delta CD approach does not work for spherical Zernike terms, the focus shift can be a very useful linear metric to measure spherical Zernike term variations.

Again, we can use the methodology disclosed above to maximize the slope of focus shift vs. Zernike term variation. In practice, we should also pay attention to the Bossung tilt, i.e., $$c_{f_0,z_{n0}}(x, y) = \frac{\partial^2 AI(x, y)}{\partial f^2}\bigg|_{f=f_0, z=z_{n0}}.$$

Since if there is no constraint on Bossung tilt, a direct maximization on the slope of focus shift vs. Zernike may lead to very small Bossung tilt, which is undesired, since if the Bossung tilt is too small, it becomes very difficult to pinpoint the best focus accurately.

It should be noted that even though we analyze the focus shift for AI intensity at a particular point, the analysis for resist image (RI) intensity and CD is similar, and they both have linear response to Zernike variation. Therefore, RI may also be used for CD measurement.

Further, as a general approach (not limited to linear gauge design or aberration monitoring), we can apply a pattern selection algorithm to reduce the redundancy. This two-step approach, i.e., combining orthogonal gauge design and pattern selection, can facilitate maximum pattern coverage with minimum gauge number. In fact, one can also use all possible patterns or sample all those patterns with a sufficient sampling rate as candidates for the pattern selection algorithm to ensure optimal pattern coverage, if the run time is acceptable.

As we have mentioned, CD serves as a main example for the metric used in the cost function, we can certainly use other metrics such as focus shift, spacing, overlay error (or, edge placement error, EPE, also referred to as pattern shift) etc. to design gauges. For example, we can measure spacing between two patterns to determine the Zernike variation. Pattern shift (or overlay) is another important and commonly used metric, therefore, we can also design pattern or pattern pairs with certain symmetry. We then apply the above mentioned methodologies to maximize the pattern shift with respect to Zernike variation or any generic optical parameter variation.

We can also use a variety of cost functions, for example, we can design single gauges to maximize the ratio between the 1st order CD sensitivity and the 2nd order CD sensitivity to achieve better linearity. Also, it is to be noted that some or all of the even order (not only the 2nd order) responses can be cancelled, while some or all the odd order responses (1st, 3rd, and higher) are kept from our symmetric pattern pair design, thus we can also design pattern pairs to maximize the ratio between, for example, the 1st order CD sensitivity and 3rd and higher order CD sensitivity to further suppress any residue non-linear terms thus further improve the linearity of the CD difference.

Even though in this application, we use Zernike terms as the primary example to demonstrate the methodology, this method can certainly be generalized to other representations of the aberrations or even other scanner parameters, for example, pupil fit parameters which are known to contribute to nonlinear CD response. We can use this method to improve the linearity for such scanner parameters. We can also design patterns or pattern pairs with strong first order and third order response to lock down the sign of parameters such as defocus.

As mentioned before, the gauge design method is not limited to have linear response to parameter variations. For some parameters that lead to strong quadratic effect but very small or even zero linear effect, we can use the methodologies to cancel the residual linear effect instead, so to leave a pure quadratic effect. Such design is still an improvement over a gauge with mixing linear and quadratic responses.

A method to maximize the Signal-to-Noise Ratio (SNR) is also disclosed. The measurements are CD1 from pattern P1 and CD2 from pattern P2, both of which should have a certain noise level, s1 and s2. Note that the patterns may or may not be symmetric. Now we define the monitoring metric as, CD=w1*CD1+w2*CD2., where w1 and w2 are two preset constants. Assuming the measurement noise for two patterns are independent, then the noise in the monitoring metric is:

$$\frac{|w_1 a_1 + w_2 a_2|}{\sqrt{w_1^2 \sigma_1^2 + w_2^2 \sigma_2^2}}$$

We also want to pick w1 and w2 such that the quadratic terms cancel, so w1*b1+w2*b2=0 is a constraint, where b1 and b2 are the quadratic sensitivities of P1 and P2, respectively. We then want to identify the best patterns and best w1 and w2 to maximize the term $$\frac{|w_1 a_1 + w_2 a_2|}{\sqrt{w_1^2 \sigma_1^2 + w_2^2 \sigma_2^2}}$$

under the constraint that w1*b1+w2*b2=0, where a1 and a2 are the linear sensitivities of P1 and P2, respectively.

Lithographers can choose gauges designed for different cost functions to further improve pattern coverage. For example, some gauges may be designed for linear CD responses, some are designed for quadratic CD responses, some are designed for maximum focus shift, some are designed for overlay etc. It is possible to combine different gauges designed for different parameters together, with or without pattern selection. Such a combination of gauges leads to even greater robustness against random error and degeneracy.

Figure 8:
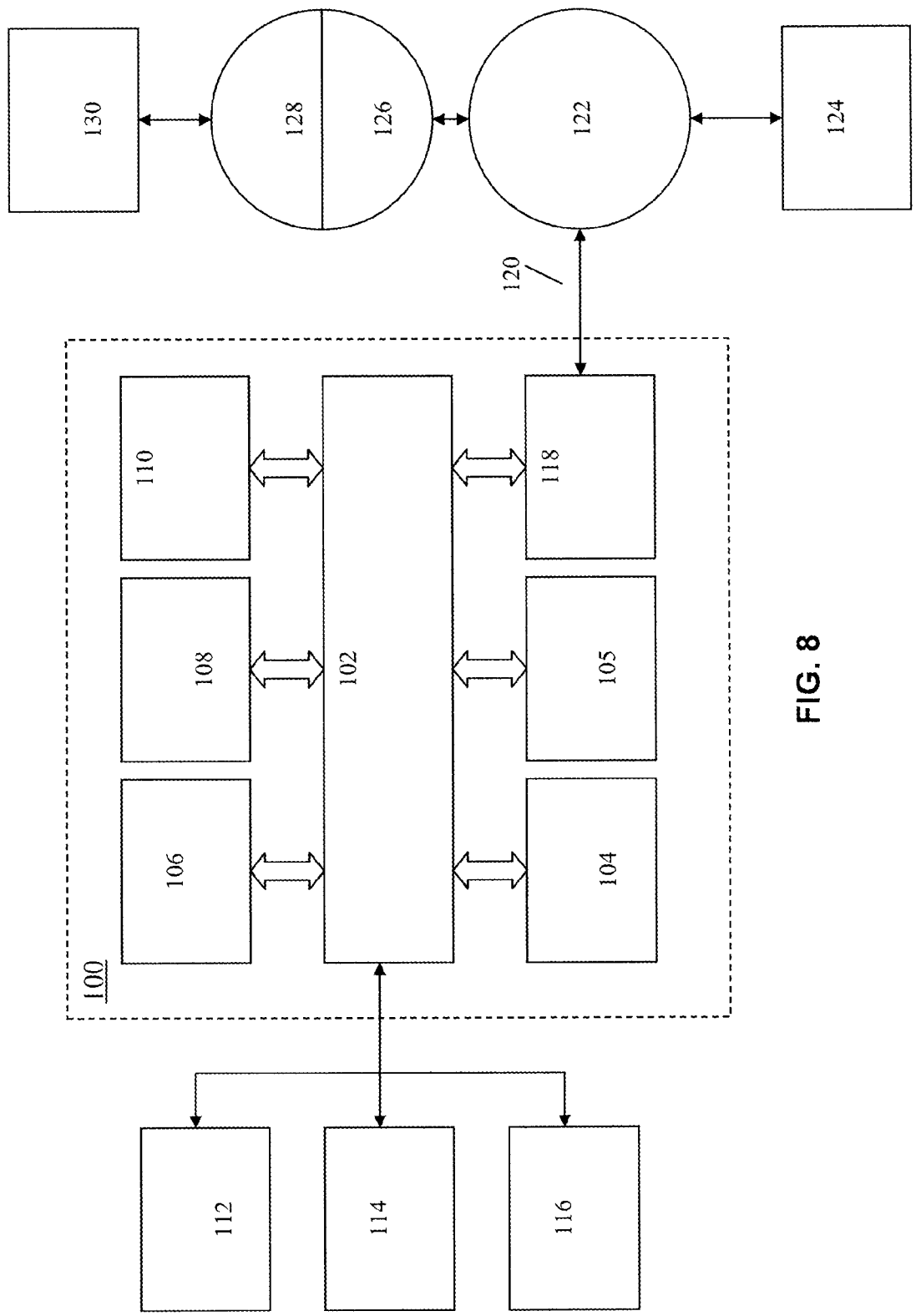
FIG. 8 is a block diagram of an example computer system in which embodiments of the invention can be implemented.

C. Details of a Computer System for Implementing the Embodiments of the Present Invention FIG. 8 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

D. Example Lithography Tool

FIG. 9 schematically depicts an exemplary lithographic projection apparatus whose performance could be simulated and/or optimized utilizing the computational lithography models that are calibrated using the test pattern selection process of present invention. The apparatus comprises:

- a radiation system IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method of designing a set of test patterns for being imaged via a projection lithography system, the set of test patterns comprising a lithography response parameter related to a predefined wavefront aberration term of the projection lithography system, the predefined wavefront aberration term mathematically representing a characteristic of a wavefront aberration, the method comprising the steps of:
   a) generating a mathematical series expansion as an approximation of the lithography response parameter as a function of the predefined wavefront aberration term;
   b) selecting a set of selected expansion terms from the mathematical series expansion;
   c) generating a cost function comprising the selected expansion terms; and
   d) solving the cost function to define the parameter of the set of test patterns while constraining at least part of the unselected expansion terms substantially to zero for generating a set of test patterns having a predefined response on a variation of a specific wavefront aberration term.
2. The method of clause 1, wherein a deviation from the predefined response is configured to be used as a metric to monitor if the wavefront aberration has temporally drifted outside of a predefined range of acceptable wavefront aberration values corresponding to a wavefront aberration setting of the projection lithography system.
3. The method of clause 1, wherein a deviation from the predefined response is configured to be used as a calibration metric to reconstruct the real value of the wavefront aberration. This embodiment may be beneficial when the predefined response is a substantially linear response on a variation of a specific wavefront aberration term.
4. The method of clause 1, wherein the set of test patterns include at least two test patterns whose combined lithographic responses to the variations of the wavefront aberration terms are predefined.
5. The method of clause 4, wherein the at least two test patterns are symmetric to each other.
6. The method of clause 4, wherein the at least two test patterns are asymmetric to each other.
7. The method of any of clauses 2 and 3, wherein data is collected to quantify the deviation from a desired predefined response during a wafer metrology step performed by a wafer inspection tool after the wafer is exposed using a reticle containing the set of test patterns.
8. The method of clause 7, wherein the quantified deviation from the desired predefined response is used to adjust control knobs in the projection lithography system such that the wavefront aberration is maintained substantially close to a desired wavefront aberration setting. Also this embodiment may be beneficial when the predefined response is a substantially linear response on a variation of a specific wavefront aberration term.
9. The method of clause 7, wherein the reticle is a monitor reticle whose layout includes at least some of the test patterns from the designed set of test patterns.
10. The method of clause 1, wherein the lithography response parameter is selected from one or more of the following: critical dimension (CD), overlay, side-wall angle (SWA), and focus shift.
11. The method of clause 4, wherein the combined lithography response parameter is selected from one or more of the following: critical dimension (CD) difference, overlay difference, side-wall angle (SWA) difference, focus shift difference.
12. The method of clause 1, wherein a controlled amount of spatially varying wavefront aberration is intentionally introduced by design in projection optics components of the projection lithography system for improving imaging quality across the wafer.
13. The method of clause 1, wherein the wavefront aberration terms comprise coefficients of Zernike polynomials.
14. The method of clause 13, wherein the Zernike polynomial comprises spherical Zernike coefficients with rotational symmetry.
15. The method of clause 5, wherein for a known illumination source and a single term of wavefront aberration, the test patterns are designed with one of the following symmetries: vertically symmetric, horizontally symmetric, and angularly symmetric where one test pattern is obtained by rotating another test pattern by a certain angle.
16. The method of clause 1, wherein the designing of test patterns comprises:
   choosing at least two design parameters characterizing the test pattern, wherein the at least two design parameters are substantially orthogonal to each other in a wavefront aberration variation sensitivity parametric space.
17. The method of clause 16, wherein the wavefront aberration variation sensitivity space is characterized by response to pseudo-transmission-cross-coefficients (TCCs).
18. The method of clause 1, wherein the step of designing the set of test patterns comprises:
   defining an initial set of design parameters that characterizes test patterns in a pool of known test patterns;
   defining a multi-variable cost function comprising the initial set of design parameters;
   optimizing the multi-variable cost function to select a subset of design parameters that are relatively more sensitive to variation of wavefront aberration; and
   outputting a design layout that includes the set of test patterns selected from the pool of known test pattern that are characterized by the selected subset of design parameters.
19. The method of clause 18, wherein optimizing the multi-variable cost function comprises one of: joint optimization of design parameters, alternative optimization of design parameters, and brute force optimization of design parameters.
20. The method of clause 18, wherein the subset of design parameters include at least two parameters which are substantially orthogonal to each other in a wavefront aberration variation sensitivity parametric space.
21. The method of clause 18, wherein the optimization step is performed with physical constraints associated with the lithography process.
22. The method of clause 21, wherein the constraints include one or more of: mask rule check (MRC) constraints, inverse log slope (ILS), resist image contrast, depth of focus (DOF).
23. The method of any of clauses 1 and 4, wherein the test patterns comprise one-dimensional or two-dimensional patterns.
24. The method of clause 1, wherein the designing the test patterns include designing and placement determination of assist features that enhance imaging quality of the test patterns on a wafer.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

What is claimed is:

1. A method, implemented by a computer, selecting a set of test patterns for being imaged via a projection lithography system, the set of test patterns having a predetermined characteristic of a lithography response to a predefined wavefront aberration term of the projection lithography system, the predefined wavefront aberration term mathematically representing a characteristic of a wavefront aberration of the lithography system, the method comprising the steps of:
   a) generating a mathematical series expansion as an approximation of the lithography response as a function of the predefined wavefront aberration term;
   b) selecting a set of selected expansion terms from the mathematical series expansion;
   c) generating a cost function comprising the selected expansion terms;
   d) solving, using the computer, the cost function to define coefficients corresponding to the predefined wavefront aberration term while constraining at least part of the unselected expansion terms substantially to zero; and
   e) selecting the set of test patterns from among a group of patterns using the coefficients.

2. The method of claim 1, wherein the set of test patterns comprises one or more test patterns.

3. The method of claim 1, wherein the group of patterns comprises one of a set of patterns designed specifically for testing purposes, and a set of patterns selected from a design layout of a device layer.

4. The method of claim 1, wherein the set of selected expansion terms comprises one or more expansion terms.

5. The method of claim 1, wherein the set of selected expansion terms represents a linear approximation part of the mathematical series expansion.

6. The method of claim 1, wherein the predefined wavefront aberration term comprises a Zernike term.

7. The method of claim 6, wherein the Zernike term comprises spherical Zernike coefficients with rotational symmetry.

8. The method of claim 1, wherein the steps a) to d) are performed sequentially for individual wavefront aberration terms.

9. The method of claim 1, wherein the step of generating the mathematical series expansion as a function of the predefined aberration term includes generating the mathematical series expansion as a function of a plurality of predefined aberration terms for defining the parameter for the plurality of predefined aberration terms simultaneously.

10. The method of claim 1, wherein the set of test patterns comprise one of substantially binary structures, and phase-shifting structures.

11. The method of claim 1, wherein the lithography response comprises one of CD, pattern shift, focus shift, and spacing between two features.

12. The method of claim 1, wherein the cost function comprises one of CD, overlay, side-wall angle (SWA), and, focus shift.

13. The method of claim 1, wherein the set of test patterns include at least two test patterns whose combined lithographic responses to variations of the wavefront aberration terms are predefined.

14. The method of claim 13, wherein the at least two test patterns are symmetric to each other.

15. The method of claim 13, wherein the at least two test patterns are asymmetric to each other.

16. The method of claim 13, wherein data is collected to quantify deviation from the predefined response during a wafer metrology step performed by a wafer inspection tool after a wafer is exposed by the projection lithography system using a reticle containing the set of test patterns.

17. The method of claim 16, wherein the quantified deviation from the predefined response is used to adjust control knobs in the projection lithography system such that the wavefront aberration is maintained substantially close to a desired wavefront aberration setting.

18. The method of claim 1, wherein a controlled amount of spatially varying wavefront aberration is intentionally introduced by design in projection optics components of the projection lithography system for improving imaging quality across the wafer.

19. The method of claim 1, wherein for a known illumination source and the predefined wavefront aberration term, the test patterns are designed with one of the following symmetries: vertically symmetric, horizontally symmetric, and angularly symmetric where one of the at least two test patterns is obtained by rotating another of the at least two test patterns by a certain angle.

20. The method of claim 1, wherein selecting includes:
   choosing at least two design parameters characterizing one of the test patterns, wherein the at least two design parameters are substantially orthogonal to each other in a wavefront aberration variation sensitivity parametric space.

21. The method of claim 20, wherein the wavefront aberration variation sensitivity space is characterized by response to pseudo- transmission-cross-coefficients (TCCs).

* * * * *